(12) United States Patent
Heinle et al.

(10) Patent No.: US 7,751,447 B2
(45) Date of Patent: Jul. 6, 2010

(54) SYNCHRONIZATION OF TIME BASE UNITS

(75) Inventors: Frank Heinle, Nürnberg (DE); Andreas Bening, Roethenbach/Peg. (DE)

(73) Assignee: ST-Ericsson SA, Plan-les-Ouates (CH)

( * ) Notice: Subject to any disclaimer, the term of this patent is extended or adjusted under 35 U.S.C. 154(b) by 623 days.

(21) Appl. No.: 10/585,803

(22) PCT Filed: Jan. 3, 2005

(86) PCT No.: PCT/IB2005/050008

§ 371 (c)(1),
(2), (4) Date: Jul. 12, 2006

(87) PCT Pub. No.: WO2005/069661

PCT Pub. Date: Jul. 28, 2005

(65) Prior Publication Data

US 2007/0165594 A1    Jul. 19, 2007

(30) Foreign Application Priority Data

Jan. 13, 2004    (EP)    ................................. 04100088

(51) Int. Cl.
*H04J 3/06*    (2006.01)
(52) U.S. Cl. .................................................... 370/503
(58) Field of Classification Search ................. 370/503, 370/310, 345, 350, 464, 498, 520; 455/231, 455/502
See application file for complete search history.

(56) References Cited

U.S. PATENT DOCUMENTS 5,059,926 A * 10/1991 Karczewski ................. 331/47
5,805,871 A * 9/1998 Baxter ......................... 713/500
5,845,204 A * 12/1998 Chapman et al. .......... 455/343.1
6,785,352 B1 * 8/2004 Ranta ........................... 375/354
7,412,266 B2 * 8/2008 Underbrink et al. ......... 455/574
2002/0128007 A1 * 9/2002 Miyatani ..................... 455/423
2003/0224819 A1 * 12/2003 Sanchez .................... 455/552.1
2004/0067742 A1 * 4/2004 Ormson ...................... 455/258
2005/0042996 A1 * 2/2005 Khlat et al. .................. 455/255

FOREIGN PATENT DOCUMENTS

WO    WO 02/104050        12/2002
WO    WO 02/104050 A1 *   12/2002

* cited by examiner

*Primary Examiner*—Derrick W Ferris
*Assistant Examiner*—Omar Ghowrwal
(74) *Attorney, Agent, or Firm*—Eric M. Ringer; Seed IP Law Group PLLC

(57) ABSTRACT

Due to emerging cellular standards, such as UMTS, TDMA and WLAN, there is more and more need for so-called multi-mode mobile phones, i.e. phones which support not only one air interface but at least two. According to an exemplary embodiment of the present invention, a simplified synchronization of a plurality of time base units in a receiving station, such as a multi-mode mobile phone, is provided, in which the plurality of time base units is synchronized by performing a calibration of one first time base unit only and then using the calibration for synchronizing the other time base units with the calibrated first time base unit. Since the synchronization of the various time base units can be performed by software, the number of hardware components for synchronization may be significantly reduced.

20 Claims, 6 Drawing Sheets

SYNCHRONIZATION OF TIME BASE UNITS

BACKGROUND

1. Technical Field

The present invention relates to the field of synchronization of time base units. In particular, the present invention relates to a method of synchronizing a first and a second time base unit in a receiving station, to a communication system for synchronizing a first and a second time base unit, to a receiving station for a communication system for synchronizing a first and a second time base unit and to a software program product for performing a synchronization of a first and a second time base unit.

2. Description of the Related Art

Due to emerging cellular standards such as Universal Mobile Telecommunications Systems (UMTS), General System for Mobile Communications (GSM), Wireless Local Area Network (WLAN), Time Division Synchronous Code Division Multiple Access (TD-SCDMA) and Bluetooth there is more and more need for so-called multi-mode mobile phones, i.e. phones which support not only one air interface, but at least two. In many cases, these phones have to support inter-system operations, i.e. they have to be capable of making voice or data calls on all supported standards. Sometimes, even multi-standard handovers, i.e. a transition between the systems during a call, have to be supported, for example, between UMTS and GSM.

To facilitate these handovers, the maintenance of two or more time bases is needed to be able to synchronize with the different systems. A high accuracy crystal clock source, such as a voltage controlled temperature compensated crystal oscillator (VCTCXO), is generally used in the receiving station or multi-mode mobile phone in order to maintain a time base for every system the receiving station supports.

In some modes of operation, such as a paging mode, when the receiving station is waiting for incoming calls, the receiving station may not have to perform any tasks for periods of up to several seconds. However, due to power saving considerations, today's mobile phones or receiving stations use refined power down modes as long as no direct connection with the network exists. When the receiving station enters a power saving mode or sleep mode after not having received an incoming call or other event for a certain period of time, the receiving station must still be able to receive appropriate time slot and other service information during the idle time. In other words, the various time bases in the receiving station must still be maintained, even while in these stand-by or sleeping modes.

If a receiving station is in such a so-called sleep mode, it usually switches off most internal components and initializes wake-up counters, which trigger the re-start of these components.

For integrated circuits used in multi-mode mobile phones, such as complimentary metal oxide semiconductor integrated circuits (CMOS ICs), power consumption is directly related to clock frequency. Therefore, high frequency crystal clock sources and the circuits connected to these clock sources dissipate a significant amount of power. In order to reduce the power consumption, the internal time bases are maintained by a low accuracy oscillator, such as a crystal oscillator, with a comparatively low frequency, typically 32 KHz, during the sleep mode. After wake-up from sleep mode, all internal time bases need to be readjusted accurately, which requires a complex interaction of several software and hardware components in case of a multi-mode phone.

BRIEF SUMMARY

It is an object of the present invention to provide for a simplified synchronization of a plurality of time base units in a receiving station.

According to an exemplary embodiment of the present invention, a method of synchronizing a first and a second time base unit in a receiving station is provided, the method comprising the steps of performing a calibration of the first time base unit resulting in a calibrated first time base unit and using the calibration to synchronize the second time base unit with the calibrated first time base unit.

In other words, a plurality of time base units in a receiving station is synchronized by a calibration of one first time base unit only, which may be performed on the hardware side, and a subsequent synchronization of the other time base units with the calibrated first time base unit with the help of the calibration of the first time base unit. Advantageously, the synchronization of the various time base units may be performed by software. Therefore, the number of hardware components for calibration and synchronization may be significantly reduced, since no hardware components for a calibration of the second time base unit are needed.

According to another exemplary embodiment of the present invention, a time of a first occurrence of a frame synchronization signal of the calibrated first time base unit is estimated, resulting in an estimated time. After that, the estimated time is transmitted to a counter of the second time base unit at the first occurrence of the frame synchronization signal, resulting in a synchronization of the first and second time base units.

In other words, a software synchronization of the two time base units is performed by a determination of the time of a frame synchronization signal of the first time base unit, which has already been calibrated from the hardware side. After that, this time is provided to the counter of the second time base unit at the moment at which the frame synchronization signal is transmitted from the calibrated first time base unit.

According to another exemplary embodiment of the present invention, the estimated time is written into a memory of the second time base unit and, after that, the content of the memory is copied into the counter of the second time base unit at the first occurrence of the frame synchronization signal, resulting in a synchronization of the first and second time base units.

Advantageously, according to this exemplary embodiment of the present invention, the estimated time may be written into the memory of the second time base unit any time before the first occurrence of the frame synchronization signal.

According to another exemplary embodiment of the present invention, the receiving station further comprises a first and a second supported system and a system controller, wherein the first supported system corresponds to the first time base unit and the second supported system corresponds to the second time base unit. The receiving station is in a sleep mode and a generation of a wake-up signal is triggered by one of the first time base unit and an external event. Such an external event may be the touching of a key of a keypad of the receiving station. The reason for the first time base unit to trigger the wake-up signal may be an elapsing of a pre-set sleeping time. After generation of the wake-up signal, the wake-up signal is transmitted to the system controller and the system controller transmits an activation signal to each of the first and second supported systems after receiving the wake-up signal.

Advantageously, according to this exemplary embodiment of the present invention, the wake-up signal is transmitted to the system controller, which further processes the wake-up procedure by transmitting an activation signal to each supported system; therefore the system controller has complete control of the wake-up procedure of all system components. Furthermore, if the generation of the wake-up signal is not triggered by an external event, there is only the first time base unit to trigger the wake-up signal generation. No other time base units are involved. Therefore, besides the case of an external event, only one mechanism for wake-up signal generation has to be provided, which may lead to a further reduction of hardware components.

According to another exemplary embodiment of the present invention, the receiving station further comprises a calibration unit. The system controller transmits a calibration command to the calibration unit. After that, the calibration unit calibrates the first time base unit.

Advantageously, according to this exemplary embodiment of the present invention, there may be only one calibration unit in the receiving station, although the receiving station comprises at least two time base units. This may lead to a reduction of hardware components and therefore to a saving of space and production costs. Furthermore, the system controller triggers the calibration of the first time base unit and may therefore decide at which time the calibration should be performed.

According to another exemplary embodiment of the present invention, the first time base unit and the first supported system correspond to one of GSM, EDGE, TDMA, WLAN, TD-SCDMA, Bluetooth and UMTS. Furthermore, the second time base unit and the second supported system correspond to one of GSM, EDGE, TDMA, WLAN, TD-SCDMA, Bluetooth and UMTS, wherein the first time base unit and the first supported system on the one hand and the second time base unit and the second supported system on the other hand may support different standards (the first time base unit and the first supported system may, for example, support GSM, whereas the second time base unit and the second supported system may support UMTS). Advantageously, by supporting different standards, the so-called multi-mode or multi-standard receiving station is provided.

According to another exemplary embodiment of the present invention, each of the first and second time base units has a clock rate, wherein the first time base unit is the time base unit which has the higher clock rate. Using the time base unit with the higher clock rate for triggering the wake-up signal may lead to a higher wake-up accuracy than using the time base unit with the lower clock rate.

According to another exemplary embodiment of the present invention, a communication system for synchronizing a first and a second time base unit is provided. The communication system comprises a transmitting station and a receiving station, wherein the receiving station comprises the first and second time base units. The receiving station is adapted for performing a calibration of the first time base unit, resulting in a calibrated first time base unit, and for using the calibration to synchronize the second time base unit with the calibrated first time base unit. Therefore, only one calibration unit is needed in the receiving station, and the synchronization of the second time base unit with the calibrated first time base unit may be performed by software. This may lead to a reduction of hardware components and a more direct control of the synchronization procedure by a system controller, which may be implemented in the receiving station for controlling the different systems of the receiving station.

According to another exemplary embodiment of the present invention, a receiving station for a communication system for synchronizing a first and a second time base unit is provided, wherein the receiving station comprises the first and second time base units. Furthermore, the receiving station is adapted for performing a calibration of the first time base unit and for using the calibration to synchronize the second time base unit with the calibrated first time base unit.

According to another exemplary embodiment of the present invention, a software program product is provided for a data processor, for example, in a communication system, for performing a synchronization of a first and a second time base unit. The software program product according to the present invention is preferably loaded into a working memory of the data processor. The data processor is equipped to carry out the method of the present invention as, for example, described in claim 1. The software program product may be stored on a computer readable medium, such as a CD-ROM. The software program product may also be presented over a network, such as the Worldwide Web, and can be downloaded into the working memory of the data processor from such a network.

It may be seen as the gist of an exemplary embodiment of the present invention that a plurality of time base units in a receiving station is synchronized by performing a calibration of one first time base unit only and then using the calibration for synchronizing the other time base units with the calibrated first time base unit. Since the synchronization of the various time base units can be performed by software, the number of hardware components for synchronization may be significantly reduced. Furthermore, the system controller may gain full control of the synchronization process within the system immediately after calibration of the first time base unit without having to rely on further hardware synchronization mechanisms.

These and other aspects of the present invention will become apparent from and elucidated with reference to the embodiments described hereinafter.

Exemplary embodiments of the present invention will be described in the following, with reference to the following drawings:

DETAILED DESCRIPTION

Figure 1:
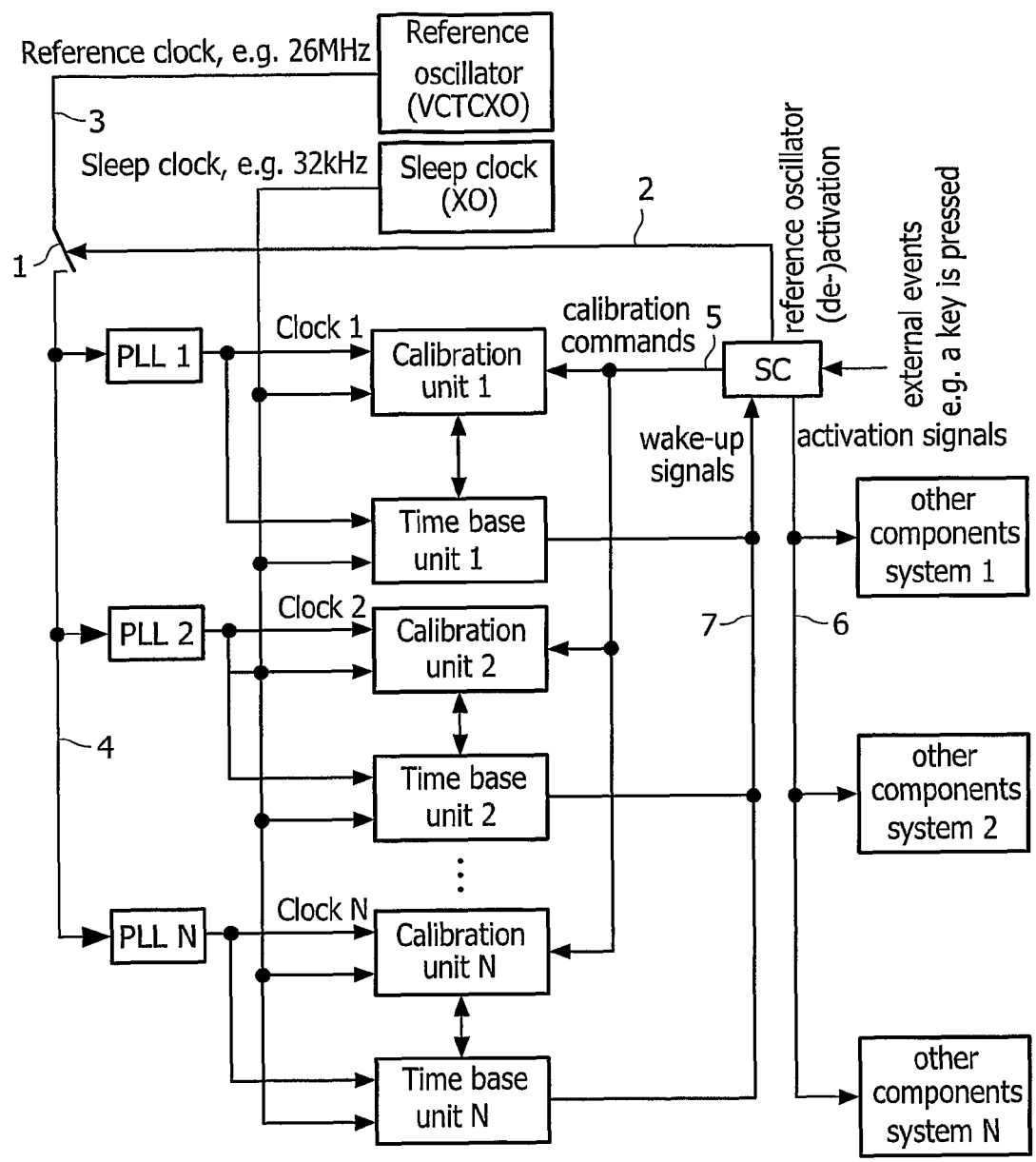
FIG. 1 shows a simplified block diagram of a receiving station.

Receiving stations, which support not only one air interface, but at least two, such as dual or multi-mode mobile phones, maintain an individual time base for every system they support. FIG. 1 shows a simplified block diagram of a receiving station supporting a plurality of N systems, in the following referred to as supported systems, which each comprise a calibration unit, a time base unit and other components (calibration unit 1, calibration unit 2, . . . , calibration unit N; time base unit 1, time base unit 2, . . . , time base unit N; other components system 1, other components system 2, . . . , other components system N).

Each of the supported systems corresponds to one respective time base unit. Each of the various time base units is connected to a reference oscillator over a Phase Lock Loop (PLL 1, PLL 2, . . . , PLL N). The reference oscillator, such as a voltage controlled temperatures compensated crystal oscillator (VCTCXO), provides each time base unit with a high frequency time signal, with a frequency of, for example, 13 MHz or 26 MHz. Each PLL converts the high frequency clock source signal to a reference signal for the corresponding time base unit and calibration unit.

The time base may be a simple counter with a clock (not shown in the figure), which is a multiple of the characteristic bit rate of the respective system provided by the reference oscillator with a frequency of e.g. 26 MHz in the form of a clock source signal or reference clock via lines 3 and 4. The counter of each time base unit generates a frame synchronization signal, which is asserted at the beginning of every frame of the corresponding system. In UMTS, the frame synchronization signal may be generated every 10 milliseconds.

During sleep mode, the reference oscillator, which generates all the clocks via the PLLs, is typically switched off to reduce the power consumption of the receiving station. The different time bases are maintained by a low accuracy oscillator, such as a crystal oscillator (XO). This low accuracy oscillator has a comparatively low frequency, such as 32 KHz, and therefore consumes much less energy than the VCTCXO, which runs at a much higher frequency.

Before the mobile phone goes into sleep mode, all the time bases are calibrated with respect to the low accuracy oscillator. During sleep mode, the time bases are clocked using the low accuracy oscillator. After the mobile phone has been woken up, the reference oscillator is switched on and again clocks the time bases with higher accuracy. This wake-up may be triggered by either an external event or by the expiration of a sleep counter inside a time base unit. The sleep counter counts the number of cycles of the low accuracy oscillator and, at a certain number of counted cycles, triggers a wake-up signal.

Obviously, there is a calibration and a sleep-mode time base needed for every air interface which is supported by the mobile phone. This is especially difficult, if the mobile phone consists of separate ICs and only one of the ICs contains the so-called system controller, which controls the complete mobile phone. Such a system controller may be an RISC processor, which runs higher layers of the protocol software and at least parts of the application software of a mobile phone.

Figure 3:
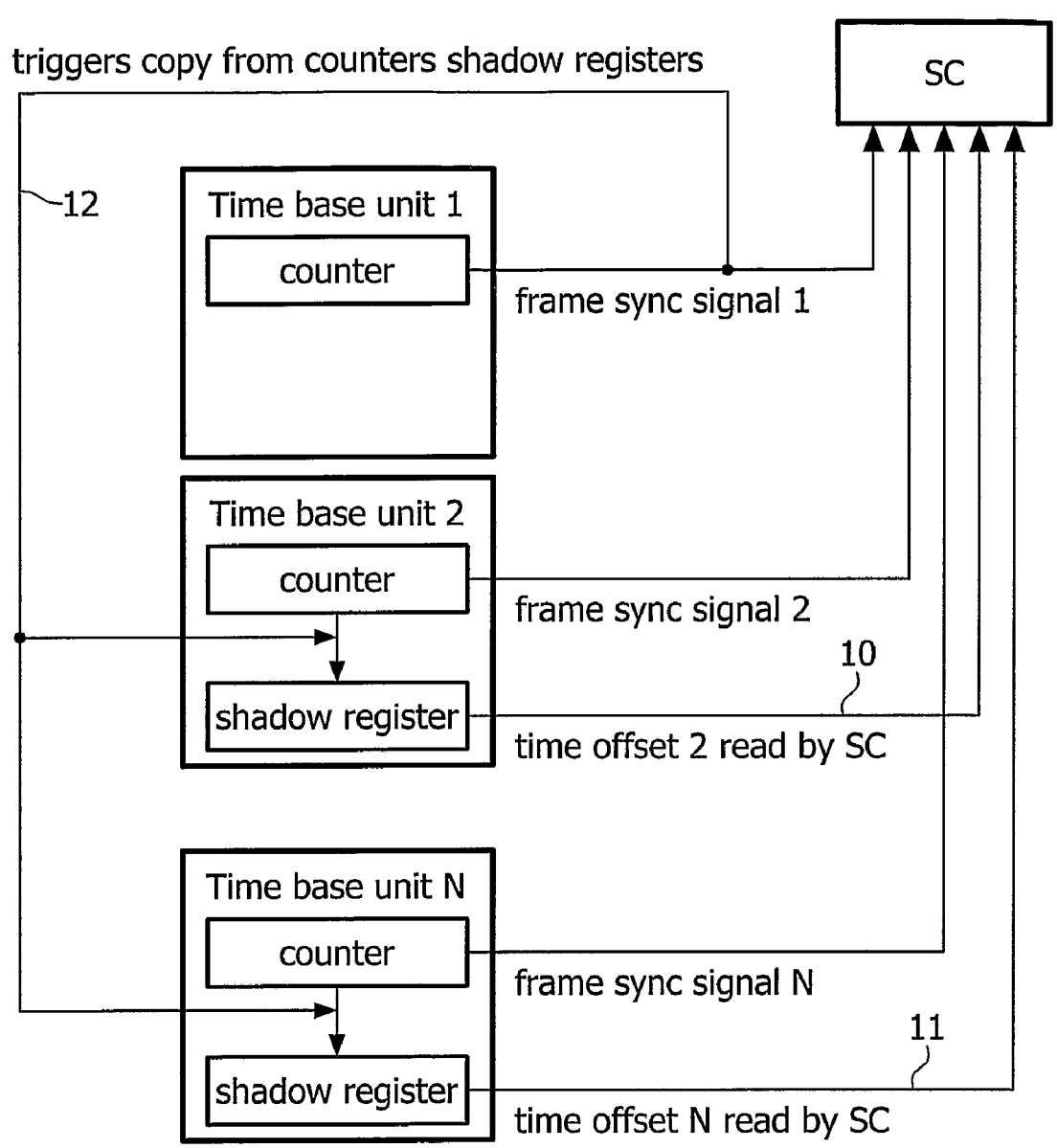
FIG. 3 shows a block diagram depicting the determination of time offsets between different time base units.

An overview of the different functional blocks of a receiving station or mobile phone supporting N different air interface standards is shown in FIG. 1. Please note that frame synchronization signals need to be available for all supported systems and for the system controller and at the time base units to guarantee a proper inter-system synchronization. These frame synchronization signals, which are not shown in FIG. 1 for reasons of clarity, are depicted in FIG. 3.

As may be taken from FIG. 1, the system controller (SC) deactivates the reference oscillator by transmitting a deactivation signal to switch 1 via line 2, if, for example, a certain time has elapsed during which the receiving station did not receive an incoming call. After cutting off the reference oscillator, the various calibration units (calibration unit 1, calibration unit 2, . . . calibration unit N) and the corresponding time base units (time base unit 1, time base unit 2, . . . time base unit N) do not receive high accuracy clock signals any more (clock 1, clock 2, . . . clock N). Instead, they are now triggered by the low accuracy but much less energy consuming sleep clock (XO), which is a low accuracy oscillator with a frequency of e.g. 32 kHz.

When the system controller receives a wake-up signal, which may be triggered by an external event or by a time base unit via line 7, the system controller reactivates the high accuracy reference oscillator by transmitting a reactivation signal to the switch 1 via line 2, which controls switch 1.

After that, the system controller transmits a calibration to every calibration unit via line 5. Each calibration unit is a hardware component which now calibrates its respective time base unit with respect to the frame synchronization signals of the other time base units and the clock signals from the reference oscillator (clock 1, clock 2, . . . , clock N), which are converted by the respective PLLs. After every time base unit has been calibrated by its respective calibration unit, the system controller transmits activation signals to the other components of the supported systems of the receiving station (other components system 1, other components system 2, . . . , other components system N) via line 6.

Figure 2:
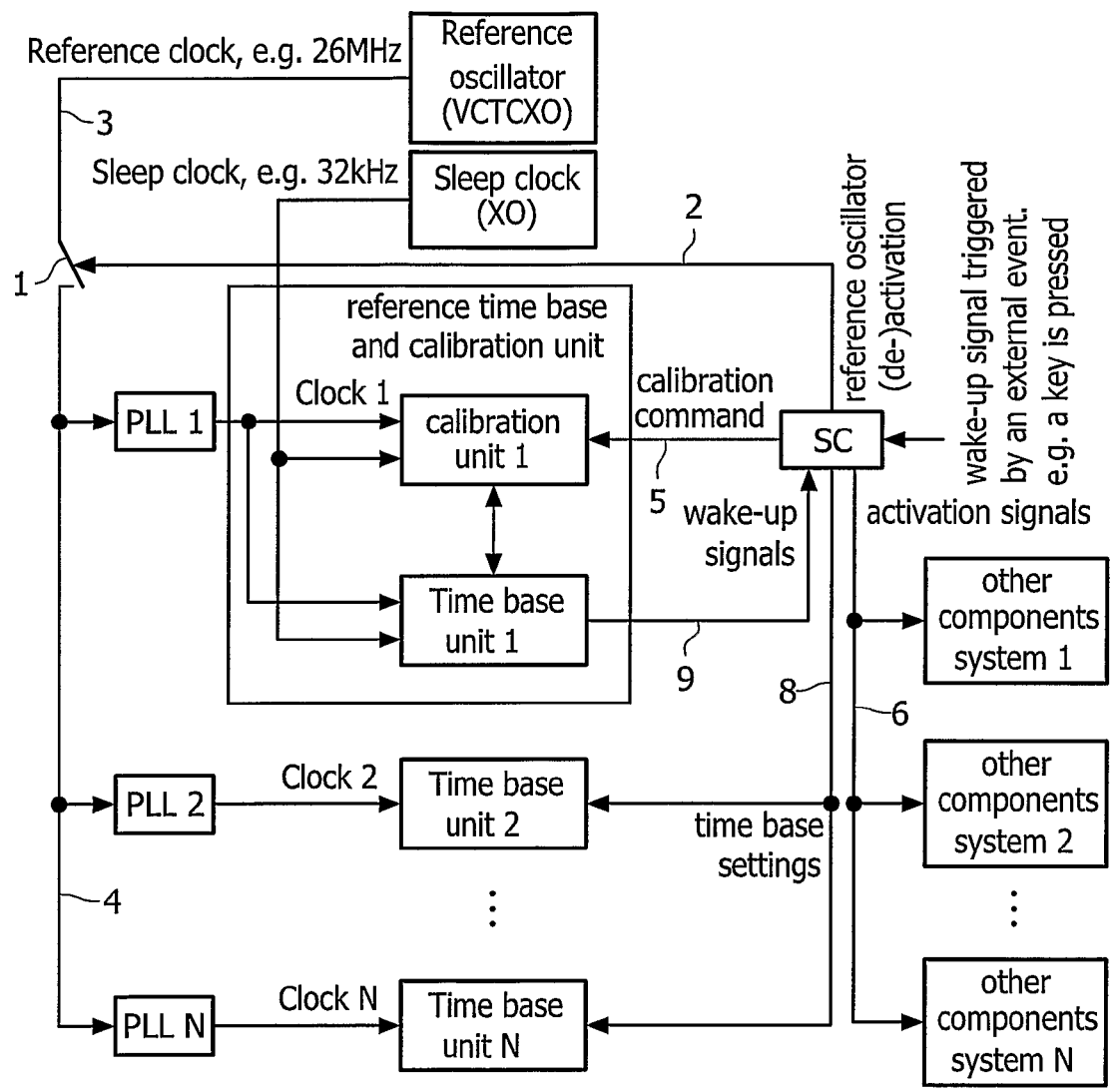
FIG. 2 shows a simplified block diagram of a receiving station according to an exemplary embodiment of the present invention.

Please note that for the description of FIGS. 1 and 2, the same reference numerals are used to designate the same or corresponding elements.

FIG. 2 shows a simplified block diagram of a receiving station according to an exemplary embodiment of the present invention. The receiving station supports N different wireless communication standards, such as GSM, EDGE, TDMA, WLAN, TD-SCDMA, Bluetooth, and UMTS, or any other wireless communication standard.

The invention makes use of the fact that it does not matter in which time base the sleep time is computed, as long as the wake-up time instant is sufficiently accurate. Due to changes in the propagation environment, most cellular systems have to deal with inaccuracies which are much bigger than the smallest unit (e.g. $\frac{1}{16}$ bits (=23 1ns) in GSM or quarter chips (=65 ns) in UMTS) of the respective time base and therefore need an additional fine synchronization after a wake-up. According to these considerations, it is not necessary to calibrate all different time bases and to provide mechanisms for wake-up signal generation in all time base units, as indicated by reference numeral 7 in FIG. 1. It is sufficient to choose one time base unit out of the N time base units, which fulfils the wake-up accuracy requirements of all supported systems. The chosen time base unit fulfilling the wake-up accuracy may therefore be the time base unit with the highest clock rate.

In the following we will assume that time base unit 1 is the reference time base unit. As may be seen from FIG. 2, only time base unit 1 is linked with a calibration unit (calibration unit 1). Accordingly, only time base unit 1 is calibrated from the hardware side. No further (hardware) calibration units are needed for performing a synchronization of all supported system components.

Time base unit 1 can be used to generate wake-up signals for all supported systems. The wake-up signal is then transmitted to the system controller via line 9. For the accurate setting of the various time base units after a wake-up the frame synchronization signal from time base unit 1 can be used, which is available at all time base units.

It is assumed that the system controller knows the relative time offsets of all time bases and is triggered by their respective frame synchronization signals. The time offsets may be determined by a simple mechanism, which is depicted in FIG. 3. In every time base unit except the reference time base unit 1, a memory, such as a shadow register, exists, which can be read by the system controller via lines 10 and 11. Both the system controller and all time base units are connected to the frame synchronization signal of the reference time base unit 1 via line 12. As soon as the reference frame synchronization signal 1 is asserted from time base unit 1 and transmitted to the other time base units via line 12, the content of each time base unit counter is copied to the respective shadow register and may then be read by the system controller via lines 10 and 11. Of course, in time base unit 1 no copying takes place, since time base unit 1 is the reference time base unit. After this, the system controller knows the offsets between the reference time base unit 1 and all the other time base units in the system.

The system controller now only needs to compute the time at the next occurrence of the reference frame synchronization signal 1 and needs to write this value into the shadow registers within time base unit 2, time base unit 3, . . . , time base unit N. This is symbolized by line 8 in FIG. 2. Each shadow register may then be copied into the corresponding timer or counter at the next occurrence of the time base unit 1 frame synchronization signal 1. This may lead to a synchronization of all time base units in the receiving station.

Please note that according to an exemplary embodiment of the present invention as depicted in FIG. 2, only time base unit 1 is able to transmit a wake-up signal to the system controller. Furthermore, only time base unit 1 is linked to a calibration unit. There are no further calibration units. Obviously, this reduces the number of hardware components for synchronization significantly. Furthermore, the system controller only needs to react to a single wake-up signal and activates all other system components based on this event. All further time settings are performed in software and do not need any further hardware synchronization mechanisms. A further advantage is that the system controller immediately has full control of the multi-mode synchronization within the system without having to relay on further hardware synchronization mechanisms.

Figure 4:
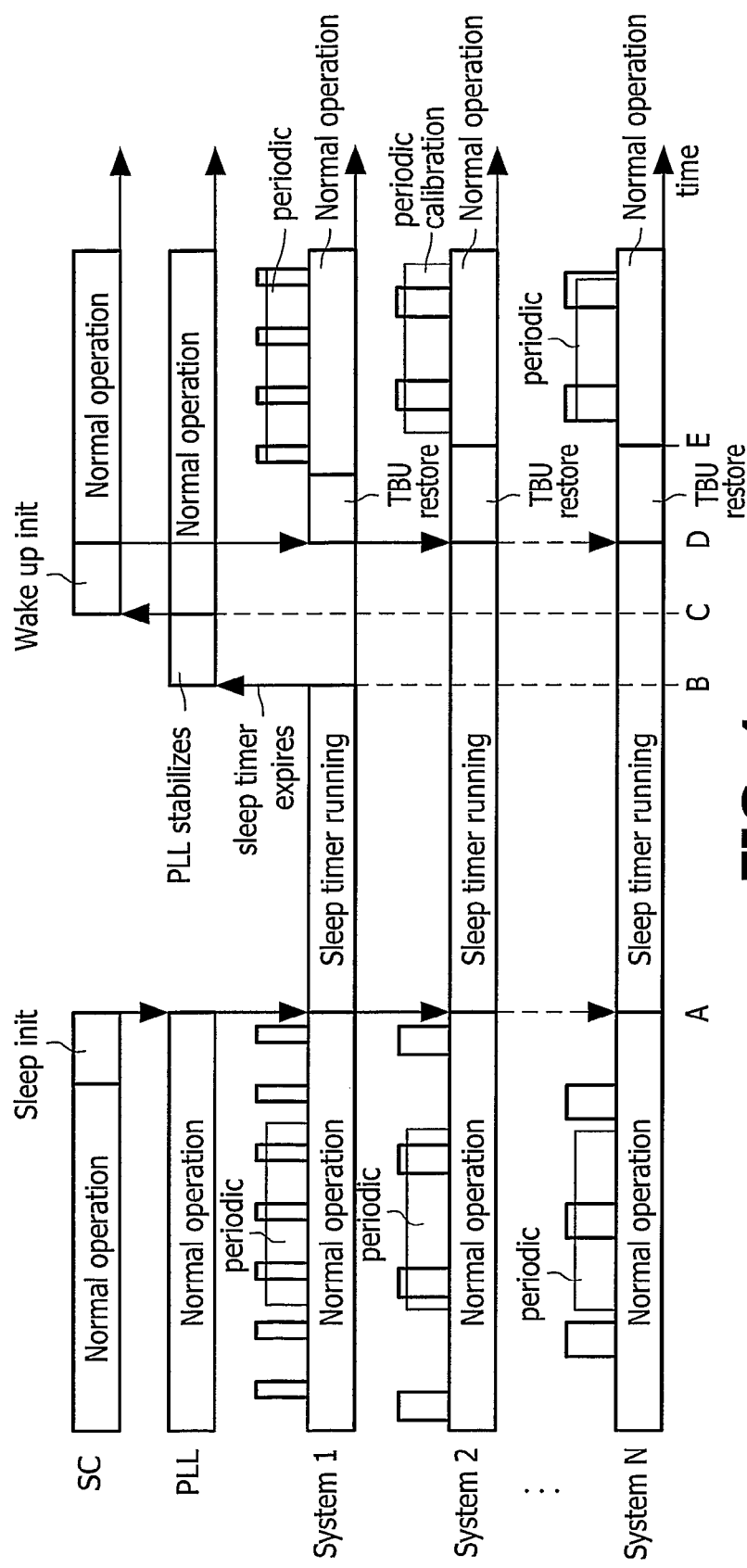
FIG. 4 shows a timing chart of a synchronization mechanism.

FIG. 4 shows a timing chart of a synchronization mechanism of a plurality of time base units in a receiving station. The receiving station supports a plurality of air interfaces, which correspond to the supported systems (system 1, system 2, . . . , system N). During normal operation, each system is triggered by its respective time base unit at a corresponding frequency, which is provided by a high accuracy clock in cooperation with a respective Phase Lock Loop (PLL).

At a certain time, for example, when the receiving station did not receive any incoming call for a certain number of clock cycles, the system controller initiates a sleep mode and sends a respective sleep init signal to the different systems, each of them comprising an individual time base unit. This is done at time A. Every system comprises a sleep timer, which may be a counter linked to a low accuracy sleep clock. When one of the sleep timers expires, as the sleep timer of system 1 at time B in FIG. 4, the respective system transmits a signal to the PLL, which then stabilizes. After stabilization of the PLL, the PLL sends a signal to the system controller (SC) at time C, which then initiates a wake-up procedure. At time D, the system controller transmits a wake-up signal to all systems. After that, each time base unit is restored. This is done by performing a calibration in each time base unit. After that, the normal operation of the systems continues at time E.

Figure 5:
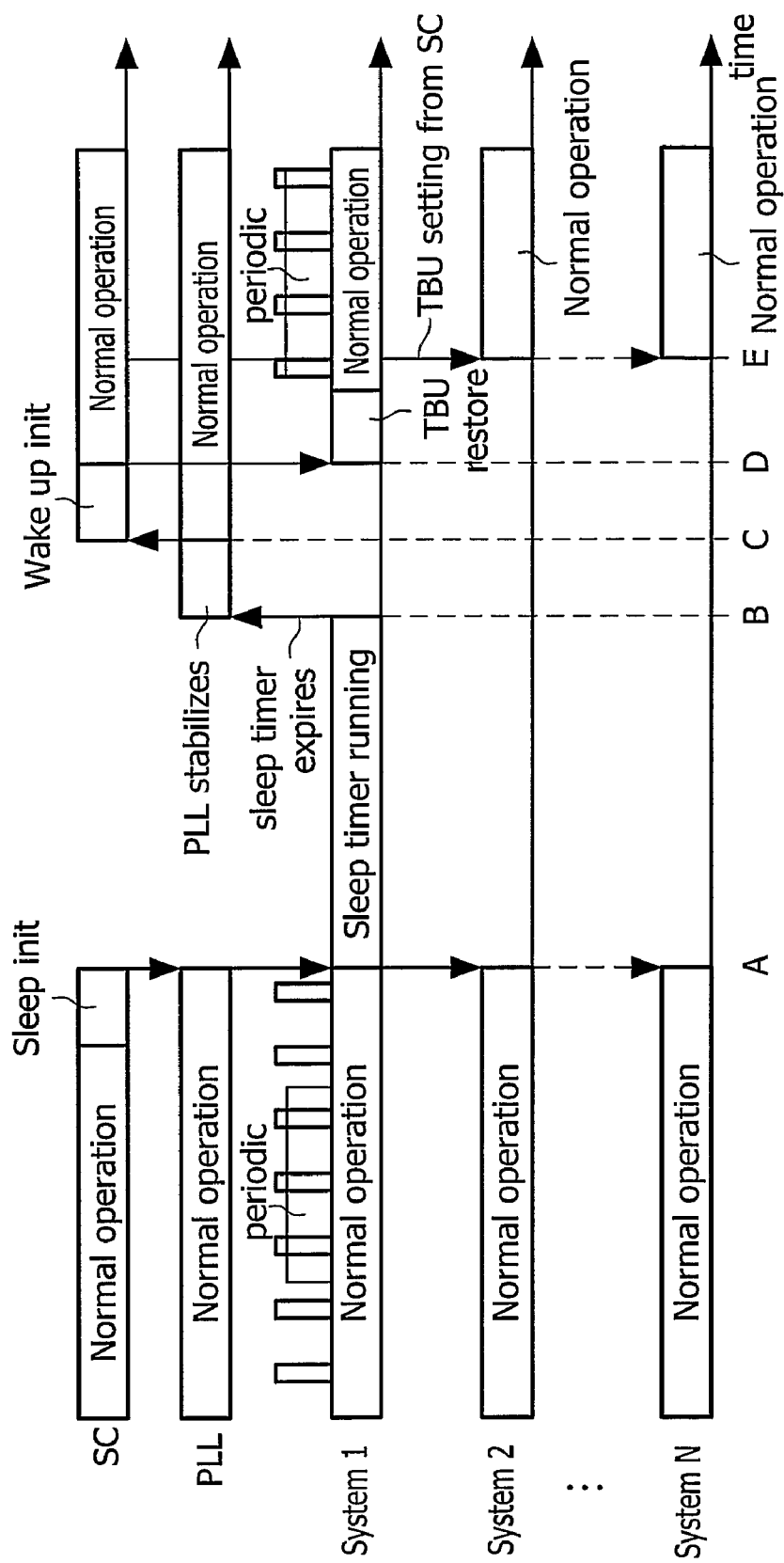
FIG. 5 shows a timing chart of a synchronization mechanism according to an exemplary embodiment of the present invention.

FIG. 5 shows a timing chart of a synchronization mechanism according to an exemplary embodiment of the present invention. Again, as already described with respect to FIG. 4, the receiving station comprises a plurality of different supported systems (system 1, system 2, . . . , system N), each system comprising various components, e.g. each system comprises a respective time base unit. But only system 1, which is the system with the highest clock rate, comprise a calibration unit.

As already described with respect to FIG. 4, the system controller (SC) initiates a sleeping mode at time A. The initiation is performed by transmitting a sleep initiation signal (Sleep init) to all the different systems. At the same time, the system controller switches off the high accuracy reference oscillator. From now on, the time base unit of system 1 is linked to the low accuracy sleep clock, as has been described with respect to FIG. 2. The sleep time of system 1 starts running and, when it expires, it transmits an appropriate signal to the Phase Lock Loop at time B. Please note that there is only one sleep timer, which is located in system 1. The other systems do not comprise sleep timers.

After receiving the message that the sleep timer of system 1 has expired, the PLL stabilizes and sends a message to the system controller at time C. The system controller now initiates a wake-up procedure and sends a calibration command to the time base unit of system 1 before continuing with its normal operation at time D. After that, the time base unit of system 1 continues the calibration. Since all the systems send their respective frame synchronization signals to the controller, as may be seen in FIG. 3, the system controller knows the relative time-offsets of all time bases and is triggered by their respective frame synchronization signals. The system controller now estimates the time at which the next frame synchronization signal of system 1 occurs, which is the reference frame synchronization signal, and writes this time into a memory, such as a shadow register, within time base unit 2, time base unit 3, . . . , time base unit N. This is done any time between D and E.

At the time E, which is the time of the occurrence of the frame synchronization signal of time base unit 1, each shadow register can be copied into the corresponding timer or counter of the time base units 2 to N. This leads to a synchronization of all time base units in the receiving station.

Figure 6:
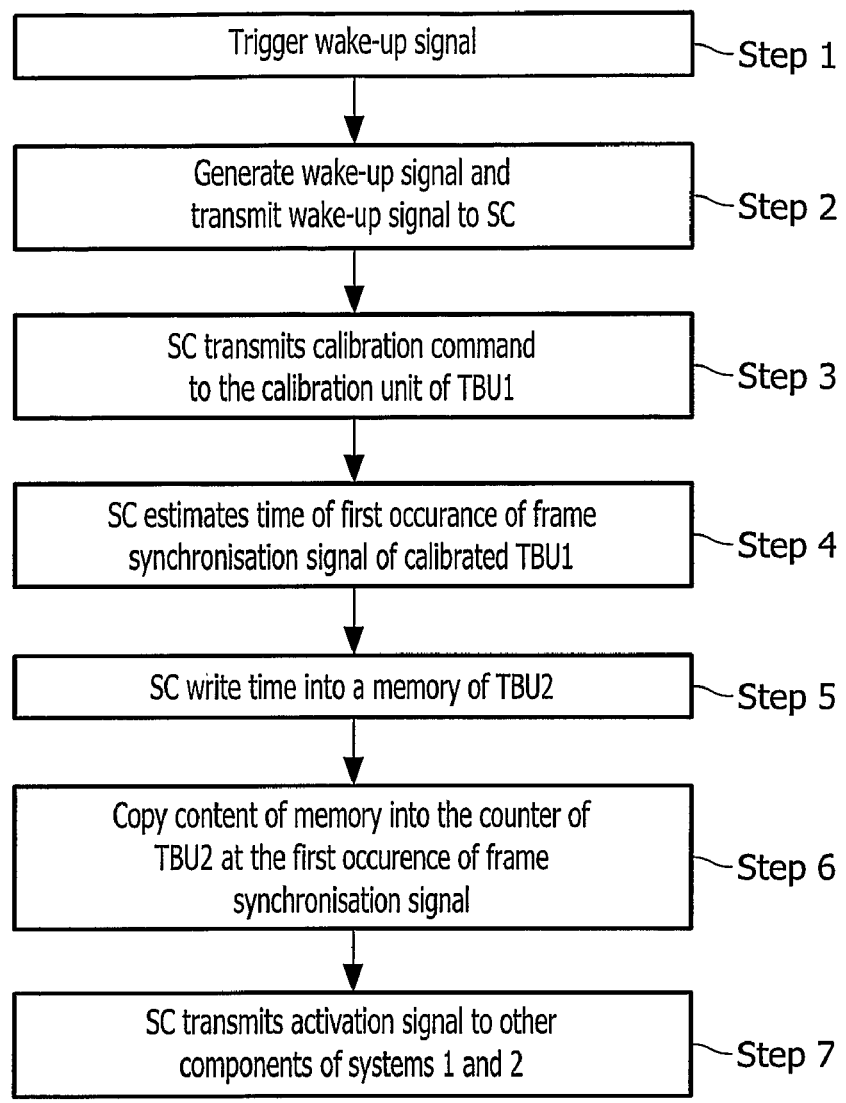
FIG. 6 shows a schematic representation of a method according to an exemplary embodiment of the present invention.

FIG. 6 shows a schematic representation of a method according to an exemplary embodiment of the present invention. At the beginning, the receiving station is in a sleep mode. In step 1, a wake-up signal is triggered, either by an external event or by the expiration of a sleep counter within time base unit 1. After that, the wake-up signal is generated and transmitted to the system controller (step 2). In step 3, the system controller transmits a calibration command to the calibration unit of time base unit 1 and the calibration unit calibrates time base unit 1. The calibration unit of time base unit 1 is a hardware component.

In step 4, the system controller estimates the time of the first occurrence of a frame synchronization signal of the calibrated time base unit 1. This is done in software and from now on the whole synchronization procedure in the hands of the system controller. No further hardware components are needed. The system controller now writes the estimated time into a memory of time base unit 2 or any other time base units in step 5. In the next step, the content of the memory of the time base unit 2 is copied into the counter of the time base unit 2 at the first occurrence of the frame synchronization signal of time base unit 1 (step 6). Therefore, the different time base units 1 and 2 are calibrated and synchronized with respect to each other. Please note that the so-called first occurrence of the frame synchronization signal does not refer to an actual first frame synchronization signal, since frame synchronization signals may be sent all the time, but it is meant to refer to the frame synchronization signal of time base unit 1, which triggers the synchronization of the different time base units.

After the synchronization of the different time base units has been performed, the system controller transmits an activation signal to other components of systems 1 to N (step 7).

Figure 7:
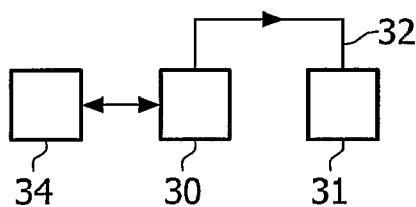
FIG. 7 shows a communication system according to an exemplary embodiment of the present invention.

FIG. 7 shows a communication system according to an exemplary embodiment of the present invention. The communication system comprises a transmitting station 30, a receiving station 31 and a computer 34. The computer is used for executing a software program product for performing a synchronization of a first and a second time base unit, according to an exemplary embodiment of the present invention, and may comprise the system controller of the receiving station. A transmission of data or data packets from the transmitting station 30 to the receiving station 31 may be performed via a wireless communication link 32. The transmission system or communication system depicted in FIG. 7 is adapted to perform the synchronization of a first and a second time base unit, which are integrated in the receiving station 31. Furthermore, the receiving station is adapted for performing a calibration of the first time base unit, resulting in a calibrated first time base unit, and for using the calibration to synchronize the second time base unit with the calibrated first time base unit.

The invention claimed is:

1. A method of synchronizing a first and a second time base unit in a receiving station, the method comprising the steps of:
   awakening the first time base unit from a sleep-mode to an operational-mode, where in sleep-mode the first time base unit uses timing signals at a first clock rate from a first reference clock;
   after the first time base unit is awoken and while the first time base is in operational-mode, receiving timing signals at a second clock rate from a second reference clock at the first time base unit, wherein the second clock rate is higher than the first clock rate, and wherein the first time base unit uses the timing signals at the second clock rate in operational-mode;
   performing a calibration of the first time base unit, independently of the second time base unit, after the first time base unit is awoken based at least on the timing signals at the second clock rate from the second reference clock, resulting in a calibrated first time base unit; and
   adjusting the second time base unit based at least on the calibration of the first time base unit to synchronize the second time base unit with the calibrated first time base unit, wherein the second time base unit is communicatively isolated from the first reference clock and communicatively coupled to the first time base unit and the second reference clock.

2. The method of claim 1 wherein adjusting the second time base unit based at least on the calibration of the first time base unit to synchronize the second time base unit with the calibrated first time base unit includes:
   estimating a time of a first occurrence of a frame synchronization signal of the calibrated first time base unit, resulting in an estimated time of the first occurrence of the frame synchronization signal of the calibrated first time base unit; and
   transmitting the estimated time of the first occurrence of the frame synchronization signal of the calibrated first time base unit to a counter of the second time base unit.

3. The method of claim 2, further comprising:
   after estimating the time of the first occurrence of the frame synchronization signal of the calibrated first time base unit, writing the estimated time of the first occurrence of the frame synchronization signal of the calibrated first time base unit into a memory of the second time base unit; and
   copying content of the memory into the counter of the second time base unit at the first occurrence of the frame synchronization signal, resulting in synchronization of the first and second time base units.

4. The method of claim 1 wherein the receiving station further comprises a first and a second supported system and a system controller; wherein the first supported system corresponds to the first time base unit and the second supported system corresponds to the second time base unit; and further comprising:
   generating a wake-up signal that is triggered by one of the first time base unit and an external event while the first time base unit is in sleep-mode;
   after generation of the wake-up signal, transmitting the wake-up signal to the system controller; and
   transmitting an activation signal to the first and second supported systems from the system controller after receiving the wake-up signal.

5. The method of claim 4 wherein the first time base unit comprises a calibration unit; wherein the second time base unit comprises no calibration unit; and further comprising:
   transmitting a calibration command to the calibration unit from the system controller; and
   receiving the calibration command at the first time base unit, wherein the calibration unit performs the calibration of the first time base unit after receiving the calibration command from the system controller.

6. The method of claim 4, wherein the first time base unit and the first supported system correspond to one of GSM, EDGE, TDMA, WLAN, TD-SCDMA, Bluetooth, and UMTS; and wherein the second time base unit and the second supported system correspond to another one of GSM, EDGE, TDMA, WLAN, TD-SCDMA, Bluetooth, and UMTS.

7. The method of claim 4, further comprising:
   clocking the first time base unit at the first clock rate; and
   clocking the second time base unit at the second clock rate.

8. A communication system for synchronizing a first and a second time base unit, the communication system comprising:
   a transmitting station; and
   a receiving station that includes the first and second time base units, the receiving station configured to provide the first time base unit with timing signals at a first clock rate from a first reference clock during a sleep-mode of the first time base unit and with timing signals at a second clock rate, which is higher than the first clock rate, from a second reference clock during an operational-mode of the first time base unit and configured to perform a calibration of the first time base unit, independently of the second time base unit, after the first time base unit is awoken from sleep-mode based at least on the timing signals at the second clock rate from the second reference clock, resulting in a calibrated first time base unit, and configured to adjust the second time base unit based at least on the calibration of the first time base unit to synchronize the second time base unit with the calibrated first time base unit, wherein the second time base unit is communicatively isolated from the first reference clock and communicatively coupled to the first time base unit and the second reference clock.

9. A receiving station for a plurality of communication systems, comprising:
   a first reference clock providing timing signals at a first clock rate;
   a second reference clock providing timing signals at a second clock rate, which is higher than the first clock rate;

a first time base unit having a sleep-mode and an operational-mode and being communicatively coupled to the first reference clock and the second reference clock, the first time base unit being configured to receive and use the timing signals provided by the first reference clock at the first clock rate during the sleep-mode of the first time base unit, and the first time base unit being configured to receive and use the timing signals provided by the second reference clock at the second clock rate during the operational-mode of the first time base unit;

a second time base unit having a sleep-mode and an operational-mode and being communicatively isolated from the first reference clock and being communicatively coupled the second reference clock and the first time base unit, the second time base unit being configured to receive and use the timing signals provided by the second reference clock at the second clock rate during the operational-mode of the second time base unit;

wherein the first time base unit includes a calibration unit configured to perform a calibration of the first time base unit after the first time base unit is awoken from sleep-mode based at least on the timing signals at the second clock rate from the second reference clock and independently of the second time base unit, resulting in a calibrated first time base unit; and wherein the receiving station is configured to adjust the second time base unit based at least on the calibration of the first time base unit to synchronize the second time base unit with the calibrated first time base unit.

10. A computer readable medium having a software program for performing a synchronization of a first time base unit and a second time base unit stored therein, wherein a receiving station comprises the first and second time base units, the software program including instructions that cause a processor, when executing the software program, to:

provide the first time base unit with timing signals at a first clock rate from a first reference clock during a sleep-mode of the first time base unit and with timing signals at a second clock rate from a second reference clock during an operational-mode of the first time base unit, wherein the second clock rate is higher than the first clock rate;

perform a calibration of the first time base unit after the first time base unit is awoken from sleep-mode based at least on the timing signals at the second clock rate from the second reference clock, resulting in a calibrated first time base unit; and adjust the second time base unit based at least on the calibration of the first time base unit to synchronize the second time base unit with the calibrated first time base unit, wherein the second time base unit is communicatively isolated from the first reference clock and communicatively coupled to the first time base unit and the second reference clock.

11. A receiving station of a mobile communications device that communicates with a plurality of communication systems, the receiving station comprising:

a low frequency reference clock providing low frequency timing signals;

a high frequency reference clock providing high frequency timing signals;

a first time base unit corresponding to a first communications system of the plurality of communication systems communicatively coupled to the high frequency clock and to the low frequency clock, the first time base unit being configured to use the high frequency timing signals, which are received from the high frequency reference clock, to calibrate the first time base unit after the first base unit is awoken from a respective sleep-mode and being configured to use the low frequency timing signals, which are received from the low frequency reference clock, during a respective sleep-mode;

a second time base unit corresponding to a second communications system of the plurality of communication systems communicatively coupled to the high frequency clock but not communicatively coupled to the low frequency clock, the second time base unit being configured to be adjusted based at least on a calibration of the first time base unit after the second time base unit is awoken from a respective sleep-mode, wherein the first and the second time base units are further configured to use the high frequency timing signals from the high frequency reference clock during respective operational-modes; and wherein the first time base unit is calibrated independently of the second time base unit.

12. The receiving station of claim 11, further comprising:

a system controller communicatively coupled to the first and the second time base units and configured to estimate a time of a first occurrence of a frame synchronization signal of the first time base unit based at least on the calibration of the first time base unit and configured to provide the estimated time to the second time base unit.

13. The receiving station of claim 11 wherein the first time base unit includes a calibration unit communicatively coupled to the high frequency reference clock and configured to calibrate the first time base unit based at least on a command received from a system controller and the high frequency timing signals from the high frequency reference clock.

14. The receiving station of claim 13 wherein the second time base unit includes a memory that stores an estimated time of a first occurrence of the frame synchronization signal of the first time base unit.

15. The receiving station of claim 14 wherein the second time base unit includes a counter into which contents of the memory are copied at the first occurrence of the synchronization signal of the first time base unit.

16. The communication system of claim 8 wherein the receiving station is configured to:

estimate a time of a first occurrence of a frame synchronization signal of the calibrated first time base unit, resulting in an estimated time; and transmit the estimated time to a counter of the second time base unit at the first occurrence of the frame synchronization signal, resulting in synchronization of the first and second time base units.

17. The communication system of claim 8 wherein the first time base unit corresponds to one of GSM, EDGE, TDMA, WLAN, TD-SCDMA, Bluetooth, and UMTS; and wherein the second time base unit corresponds to another one of GSM, EDGE, TDMA, WLAN, TD-SCDMA, Bluetooth, and UMTS.

18. The receiving station of claim 9 wherein the receiving station is configured to:

estimate a time of a first occurrence of a frame synchronization signal of the calibrated first time base unit, resulting in an estimated time; and transmit the estimated time to a counter of the second time base unit at the first occurrence of the frame synchronization signal, resulting in synchronization of the first and second time base units.

19. The receiving station of claim 9 wherein the first time base unit corresponds to one of GSM, EDGE, TDMA, WLAN, TD-SCDMA, Bluetooth, and UMTS; and wherein the second time base unit corresponds to another one of GSM, EDGE, TDMA, WLAN, TD-SCDMA, Bluetooth, and UMTS.

20. The computer readable medium of claim 10 wherein the software program stored therein include further instructions to cause the processor, when executing the software program, to:

estimate a time of a first occurrence of a frame synchronization signal of the calibrated first time base unit, resulting in an estimated time; and transmit the estimated time to a counter of the second time base unit at the first occurrence of the frame synchronization signal, resulting in synchronization of the first and second time base units.

\* \* \* \* \*

UNITED STATES PATENT AND TRADEMARK OFFICE
CERTIFICATE OF CORRECTION

| | | |
|---|---|---|
| PATENT NO. | : 7,751,447 B2 | Page 1 of 1 |
| APPLICATION NO. | : 10/585803 | |
| DATED | : July 6, 2010 | |
| INVENTOR(S) | : Frank Heinle et al. | |

It is certified that error appears in the above-identified patent and that said Letters Patent is hereby corrected as shown below:

Column 4
Specification, Lines 15-16, "computer readable medium, such as a CD-ROM. The software program product may also be presented over a network," should read as, --non-transitory computer readable medium, such as a CD-ROM. The software program product may also be presented over a network,--.

Column 9
Claim 1, Lines 30-31, "time base is in operational-mode, receiving timing signals at a second clock rate from a second reference clock" should read as, --time base unit is in operational-mode, receiving timing signals at a second clock rate from a second reference clock--.

Column 11
Claim 10, Lines 30-31, "A computer readable medium having a software program for performing a synchronization of a first time base unit" should read as, --A non-transitory computer readable medium having a software program for performing a synchronization of a first time base unit--.

Signed and Sealed this
Twelfth Day of April, 2011

David J. Kappos
*Director of the United States Patent and Trademark Office*